(12) United States Patent
Dowdy et al.

(10) Patent No.: US 6,640,882 B2
(45) Date of Patent: Nov. 4, 2003

(54) REMOVABLE MOUNTING CLIP ATTACHES A MOTORIZED FAN TO AN ACTIVE HEAT SINK AND THEN THE ENTIRE ASSEMBLY TO A PART TO BE COOLED

(75) Inventors: James Glenn Dowdy, Fort Collins, CO (US); Guy Diemunsch, Fort Collins, CO (US); Guy R Wagner, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/919,150

(22) Filed: Jul. 31, 2001

(65) Prior Publication Data

US 2003/0024688 A1 Feb. 6, 2003

(51) Int. Cl.[7] ................................................. F28F 7/00
(52) U.S. Cl. ........................ 165/80.3; 165/77; 165/80.2; 165/80.1
(58) Field of Search ................................. 257/718, 719, 257/722; 165/80.3, 121, 125, 185, 120, 122; 361/697, 695, 696, 704, 707, 709

(56) References Cited

U.S. PATENT DOCUMENTS

| 5,029,638 | A | * | 7/1991 | Valenzuela | 165/164 |
|---|---|---|---|---|---|
| 5,466,970 | A | * | 11/1995 | Smithers | 257/712 |
| 5,506,752 | A | * | 4/1996 | Kong | 361/695 |
| 5,559,674 | A | * | 9/1996 | Katsui | 361/697 |
| 5,706,169 | A | * | 1/1998 | Yeh | 361/690 |
| 5,991,152 | A | * | 11/1999 | Chiou | 361/704 |

* cited by examiner

Primary Examiner—Henry Bennett
Assistant Examiner—Nihir Patel
(74) Attorney, Agent, or Firm—Edward L. Miller

(57) ABSTRACT

A removably mounted fan for an active heat sink, and the mounting of that combination to a part to be cooled, is obtained by: (1) The use a fan that engages and registers itself upon and against a top peripheral surface surrounding a cavity where the fan is to be located; (2) Holding the fan in place with one or more resilient mounting clips that span the distance from the top of the fan and an opposing outside bottom surface of the active heat sink; and, (3) Providing the resilient mounting clips with outward projecting mounting tabs that are flexible and resilient and that have mounting holes through which the resilient mounting clips (and the active heat sink they grip) can be attached to an assembly carrying the part to be cooled, such that the bottom of the active heat sink is in good thermal contact with that part.

9 Claims, 8 Drawing Sheets

REMOVABLE MOUNTING CLIP ATTACHES A MOTORIZED FAN TO AN ACTIVE HEAT SINK AND THEN THE ENTIRE ASSEMBLY TO A PART TO BE COOLED

REFERENCE TO RELATED APPLICATION

The subject matter of this Application concerns the manner of mounting a fan within the extent of a heat sink, while at the same time also providing with that manner a way to mount the entire assembly against a surface from which heat is to be removed. While various styles of heat sinks will fall within the scope of that subject matter, and are therefore of interest, there is a specific one that is of particular interest. We refer to that disclosed in U.S. Pat. No. 5,785,116 entitled FAN ASSISTED HEAT SINK, filed by Wagner on Feb. 1, 1996 and issued on Jul. 28, 1998. That Patent describes a particular type of internal fan heat sink for microprocessors, large power VLSI devices and the like, that dissipate a sufficient amount of power to require a substantial heat sink. The instant invention affords an especially desirable manner of fan attachment and heat sink mounting for that type of internal fan heat sink in particular. However, that heat sink has a number of unique properties that do not readily lend themselves to summary description: it is not itself a garden variety heat sink with a fan grafted onto it. For this reason U.S. Pat. No. 5,785,116 is hereby expressly incorporated herein by reference, so that all the unique properties of that active heat sink, including its manner of operation and manufacture, will be fully available for the understanding of this Disclosure. Such incorporation will be understood to not limit the invention to use with only the heat sink disclosed therein.

BACKGROUND OF THE INVENTION

Integrated circuits are becoming more and more powerful all the time. Not only is this true in the sense that they do more, and do it faster (e.g., in the field of microprocessors and FPGA's—Field Programable Gate Arrays), but these newer parts dissipate amounts of power that were unimaginable just a few years ago. For example, there are parts under development that will dissipate one hundred and thirty watts and will need to get rid of the attendant heat through a surface area of about one square inch. There are exotic methods of heat removal that are possible, including heat pipes, chilled water cooling and even actual refrigeration. In the main, these techniques are cumbersome or expensive, and are not suitable for high volume commercial applications in modestly priced retail equipment, such as personal computers and workstations.

The active (meaning fan assisted) heat sink described in the above incorporated Patent to Wagner was developed to deal with this situation. It is a heat sink having a spiral of fins that surround a fan around its circumferential periphery and are in its discharge path. (In other designs the fins are not a spiral, but are straight up and down. We might say they form a ring of straight fins. They occupy the same general region as do the spiral fins, however.) This makes Wagner's active heat sink a two pass device, since the design draws a portion of its air in through the periphery (one pass) and then discharges it through more fins (second pass). It is a counter flow device, since the path of heat flow is generally opposite to the direction of air flow, so that as air is heated through contact with the fins it encounters still warmer fins as it continues along its path. This ensures greater heat transfer by maintaining a temperature differential between the cooling air and the fins that are to give up their heat to the air. In addition, Wagner's active heat sink has a number of other desirable properties, such as low noise and an absence of extra mating surfaces that interfere with heat flow.

The preceding several sentences are a brief description of Wagner's active heat sink, but it is probable that, unless the reader has actually seen one, he or she will not have a completely satisfactory mental image of just what such an active heat sink really looks like. Accordingly, we have included illustrations of Wagner's active heat sink in the figures, and we have incorporated the Patent to Wagner. However, that still leaves us with the problem of a nice tidy way to refer to it: "finned counterflow two pass active heat sink" is accurate as far as it goes, but is also pretty cumbersome. Various heat sinks of this design are on the market, offered by Agilent Technologies, Inc. under the trade name "ArctiCooler", but it would be a risky business to rely on that, since we can't be sure what that term will eventually come to encompass. So, we will do as we have already begun to do above: we shall call the kind of fan-assisted heat sink described above and in the Specification of the incorporated Wagner Patent a "Wagner active heat sink", or depending upon the grammatical needs at the time, "Wagner's active heat sink." By availing ourselves of this coined phrase, we shall avoid much inconvenience. On the other hand, it will be clear that there are other fan assisted heat sinks that may benefit from the invention. When we mean to refer to the entire class of all fan assisted heat sinks that may be so benefitted (Wagner's included), we shall use the term "generic active heat sink" instead. A generic active heat sink need not be a two pass counter flow heat sink. And on the principle that whatever makes for shorter sentences is good, when it is entirely clear that we are referring to is indeed a generic active heat sink, we shall feel free to call it an "active heat sink," or just a "heat sink," as a further simplification.

It will, of course, be appreciated that as the Wagner active heat sink gains further acceptance and additional needs and applications develop, the exact size, relative shape and so forth will evolve over time. Thus, there are already small ones, medium and large sizes, and extra heavy duty ones, etc. Thus, it will be understood that the specific examples shown in U.S. Pat. No. 5,785,116 (Wagner) are merely illustrative of a general class of Wagner active heat sinks, and such specific details as the number of fins, whether they are straight or spiral, their thickness compared to their height, the number of blades on the fan, whether the thing is tall or squat, etc., are not determined by our meaning of the term "Wagner active heat sink."

To continue, then, an active heat sink has a fan and a heat receiver/dissipation element (the "heat sink" part), a particular surface of which must be brought into intimate thermal contact with the source of heat that is to be removed. We thus have the issues of mounting a fan to the heat sink portion, and of attaching the whole assembly to the part to be cooled. In conventional active heat sinks those functions have been performed with separate mechanical structures.

So, for example, and with reference to the view 1 of the prior art Wagner active heat sink shown in FIG. 1, a typical method of assembling a Wagner active heat sink involves gluing a motorized fan 3 into an interior cavity of a (spiral) finned counter flow heat sink 2. Not only does this mean: (A) That one has to discard an inherently valuable chunk of cast or machined metal (2) in the hope of being able to obtain a suitable replacement, when only the motor of the fan has failed (the life in commerce of a suitable class of replacement fan might exceed that of a particular configuration of complete Wagner active heat sink); but also, (B) It increases the time and cost associated with manufacturing the Wagner active heat sink. For example, there are cost and reliability issues surrounding the use of glue: it takes time to set and attention to process variables to ensure proper performance of the adhesive; there is testing on at least some parts in each lot to ensure that the fans are indeed attached (a pull test); and, then another fan operation test to make sure the fan wasn't damaged during the pull test. Clearly, the use of glue is not as simple as it might seem. It would be desirable if there were quick, inexpensive, reliable and removable way of attaching the motorized fan to an active heat sink.

To continue with the example of FIG. 1, a typical prior art manner of mounting a Wagner active heat sink against a part 6 in need of cooling and carried on a printed circuit board 5, was to machine onto the bottom of the finned portion a downward depending (as would be viewed in the figure, although it is not visible) cylindrical plug having the desired thermal contact area and a suitably smooth butt end. Then that is pressed through a press fit hole in mounting plate 4. The thickness of the mounting plate 4 is less than the length of the cylindrical plug, so that the butt end of the plug is exposed for unobstructed contact. That attaches the spiral finned portion 2 to the plate 4, which in turn has a pattern of mounting holes 9 that are in alignment with corresponding pattern of holes 8 in the printed circuit board 5. A collection of screws 7 (or small bolts, etc.) is then used to compress the assembled Wagner active heat sink 10 against the top of the part 6. It is not so much that this does not work: it does. But it also has some disadvantages. There is the issue of tolerances to be maintained to assure the press fit. There is having to perform the press fit. The mounting plate 4 has a relatively big foot print that takes up space on the printed circuit board 5, to the exclusion useful circuitry that might otherwise be mounted in some of that space, if the foot print were smaller. And finally, there is the issue of what goes wrong if the fasteners are not correctly tightened. The butt end of the cylindrical plug and the top of the part 6 must be in intimate thermal contact. That means that the top surface of the part 6 and the butt end of the cylindrical plug must be parallel as well as touching. Any lack of parallel contact results in extreme loss of thermal conductivity. Springs have been used to assist in allowing the parts to "over center" onto themselves and provide parallel contact over a range of screw travel, so long as certain force limits are not exceeded. But is still has to be done with care, and the springs are extra parts that introduce their own aggravations. They can get lost, or an incorrect spring can be used by mistake, etc. It would be desirable to find a less troublesome way of mounting an active heat sink to the part it is to cool.

While the Wagner active heat sink has been quite successful in the market, techniques that decrease the cost while increasing the utility of a desirable product are always welcome.

It would be especially desirable if there were one low cost and reliable manner of reversible attachment (reversible in the sense that it can be unattached without violence) that accomplished both the mounting of the motorized fan to the heat sink proper, as well as mounting the entire generic active heat sink assembly onto the part to be cooled.

What to do?

SUMMARY OF THE INVENTION

A solution to the problem of decreasing the cost and increasing the ease and reliability of removably mounting a motorized fan to either of a generic or a Wagner active heat sink, and then mounting the complete active heat sink to a part to be cooled, is to: (1) Use a motorized fan that engages and registers itself upon and against a top peripheral surface surrounding a cavity where the fan is to be located; (2) Hold the fan in place with one or more resilient mounting clips that span the distance from the top of the motorized fan and an opposing outside bottom surface of the active heat sink; and, (3) Provide the resilient mounting clips with outward projecting mounting tabs that are flexible and resilient and that have mounting holes through which the resilient mounting clips (and the active heat sink they grip) can be attached to an assembly carrying the part to be cooled, such that the bottom of the active heat sink is in good thermal contact with that part. The resilient removable mounting clip or clips may be formed of stainless steel strips suitably punched with holes and bent to shape.

DESCRIPTION OF A PREFERRED EMBODIMENT

Figure 1:
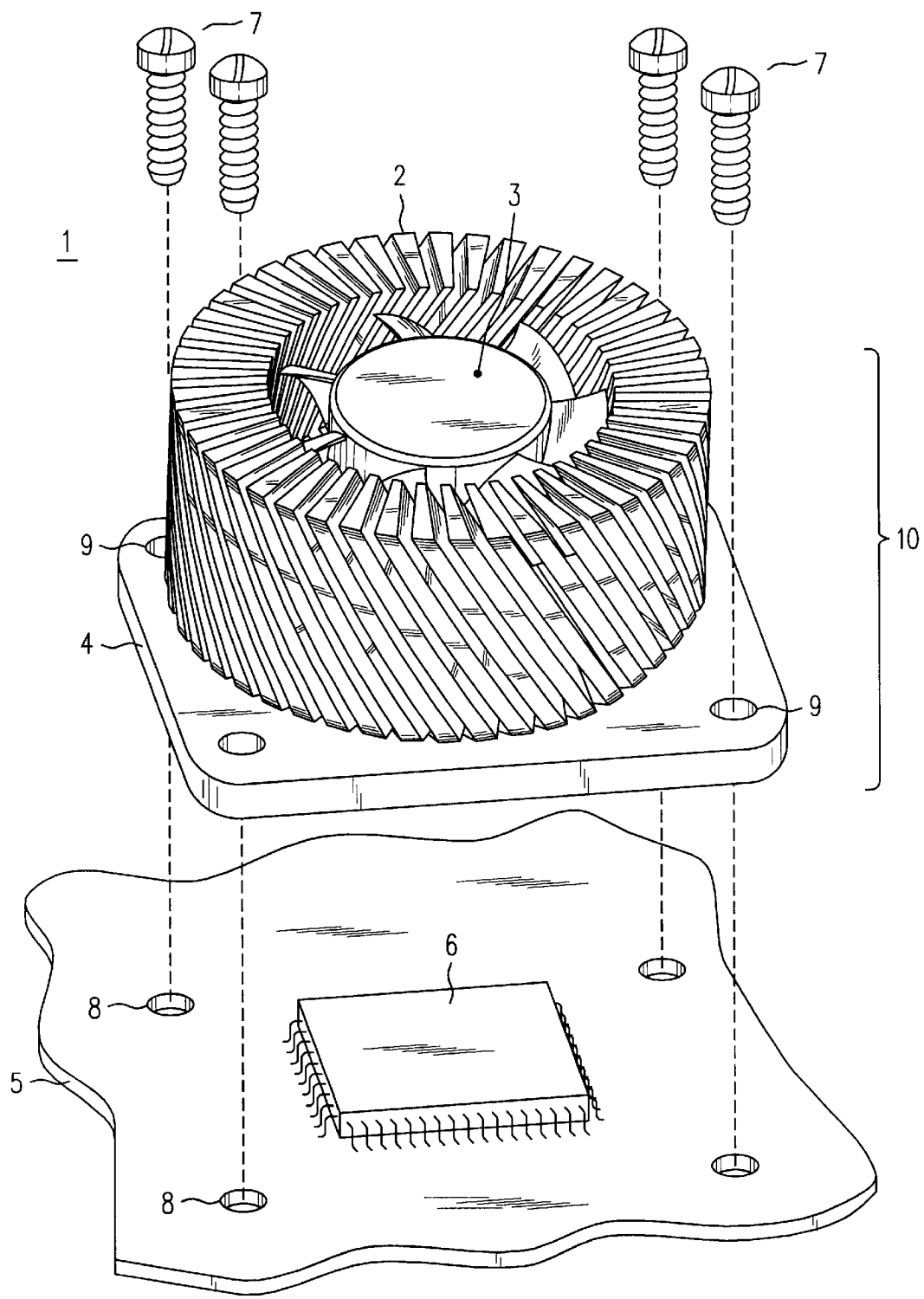
FIG. 1 is a top perspective view of a (prior art) Wagner active heat sink.
Figure 2:
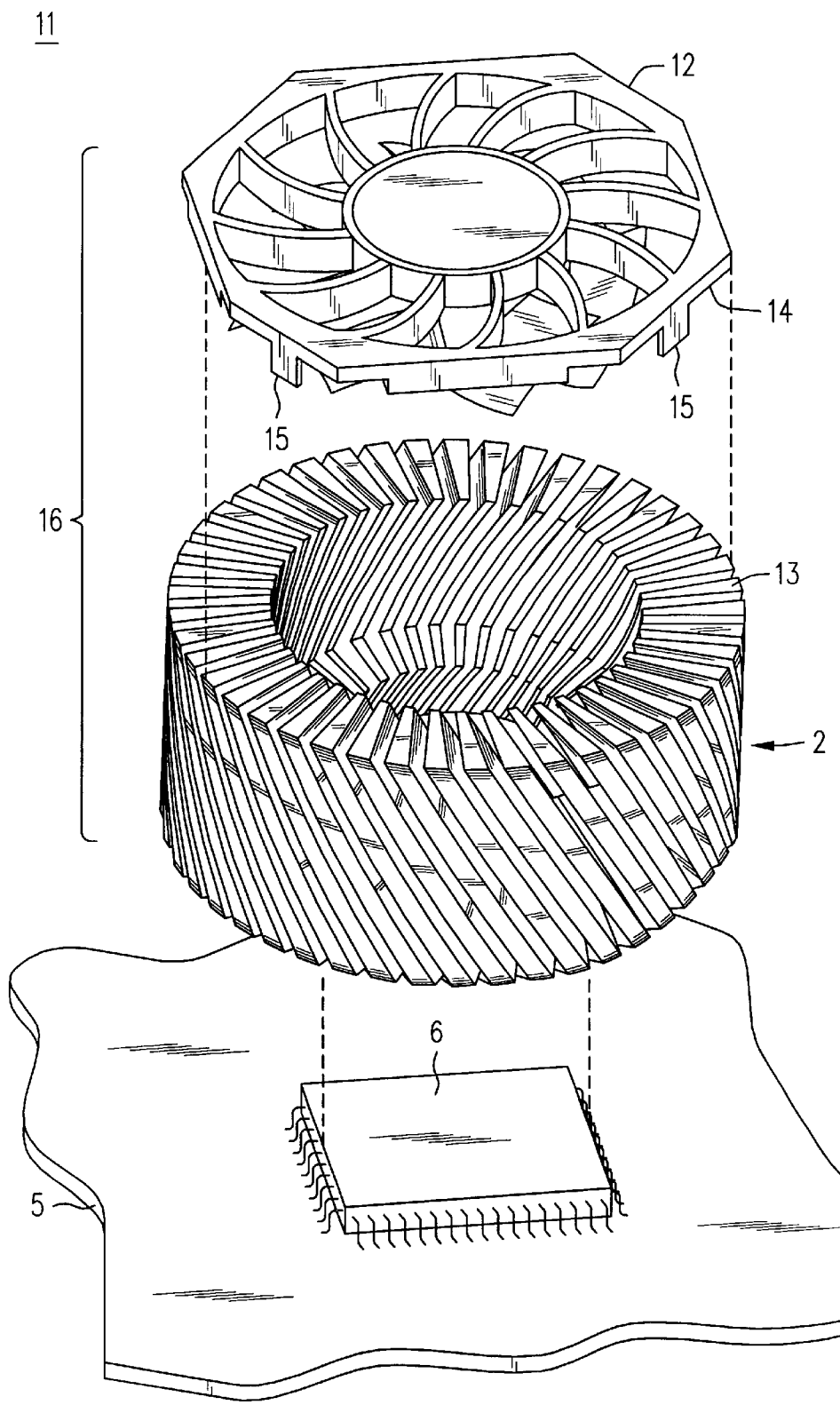
FIG. 2 is a top perspective view of a new motorized fan configuration for a Wagner active heat sink, requiring some method of mounting.

Refer now to FIG. 2, wherein is shown a top perspective view 11 of a new configuration for a Wagner active heat sink. There is an annular top surface 13 of spiral cooling fins for a finned counter flow heat sink 2, preferably of aluminum, within the center cavity of which is mounted a motorized fan 12. A mating surface 14 on the underside of the fan 12 bears against annular top surface 13. Note tabs 15, which fit over the outside of the heat sink body 2, and register the fan 12 over the center of the cavity therein. Tabs 15 could alternatively be located so as to bear against the inside of the annular ring of fins that surrounds the cavity. Not shown is the downward depending cylindrical plug whose butt end is to be in intimate thermal with the IC (Integrated Circuit) 6 or other device that is to be cooled. What we need is a handy way of (removably, or non-permanently) securing the motorized fan 12 onto the top of the heat sink body 2 (which could also be the heat sink portion of any of a variety of generic active heat sinks), while at the same time bringing the completed assembly 16 into good thermal contact with the top of part 6. "Good thermal contact" means that the contacting surfaces are parallel, and that there is some steady state compression.

Figure 3:
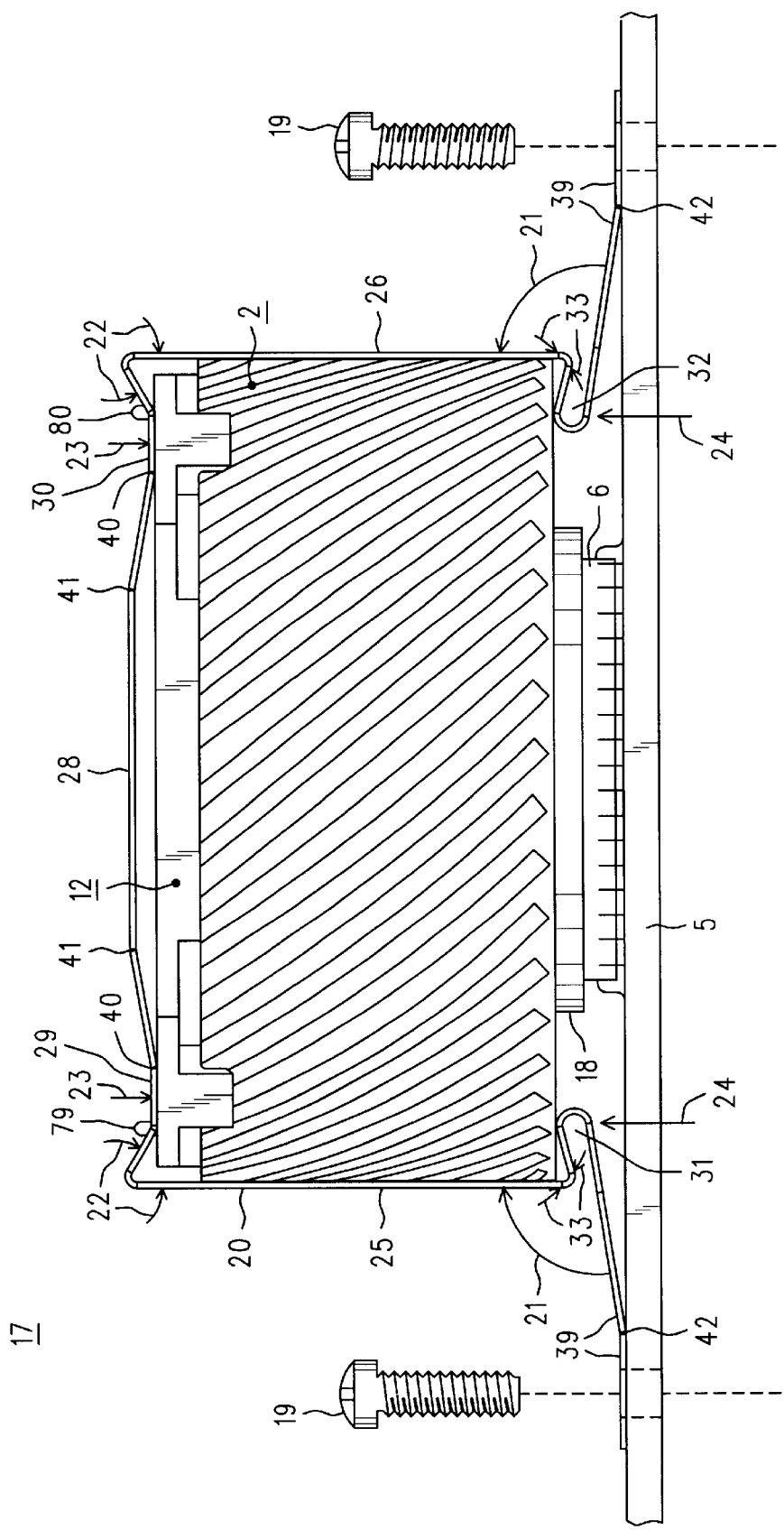
FIG. 3 is a side view of one preferred embodiment for a removable mounting clip useable with the configuration of FIG. 2.

Now refer to FIG. 3, wherein is depicted a side view 17 of one preferred embodiment for removably mounting a heat sink body 2/motorized fan 12 combination with a removable mounting clip 20 against a part to be cooled 6 that is carried by a printed circuit board 5. Also refer to FIG. 4, wherein the removable mounting clip 20 is shown in an isometric view 27.

FIG. 3 shows the downward depending cylindrical plug 18 whose butt end bears against the top of the part 6 that is to be cooled, with a contact force that is, generally speaking, in the range of about twenty to eighty pounds. The removable mounting clip 20 may be formed from type 301 full hard stainless steel sheet material. For a lesser amount of contact force the material 0.015 inches thick, and perhaps 0.040 inches thick for a considerably greater amount.

Additionally, the removable mounting clip 20 has these salient features. Note that the spacing between the side straps 25 and 26 is such as to just enclose the diameter of the heat sink body 2. This keeps the entire active heat sink from rattling from side to side (i.e., from left to right in the figure—the direction at right angles that is in and out of the paper as mentioned below). The fan 12 is held against the heat sink body 2 by a resilient pinching action in the direction of arrows 23 and 24. That pinching action arises because the side straps 25 and 26 are of non extendable length, and because of the resilience of the bends depicted by the arrows 22 and 33. Segments 29 and 30 of top strap 28 form regions of parallel contact with the top of the fan, while locations 31 and 32 make contact on the bottom of the heat sink body 2. Top strap 28 keeps the side straps 25 and 26 spaced apart (on top) at the diameter of the heat sink body 2. Top strap 28 is assisted in this by having its central portion raised away from the top of the heat sink body by the action of bends 40 and 41 The idea is that bends 40 and 41 can change slightly to accommodate slightly different diameters, without inducing a bowing into the side straps 25 and 26. Another reason for the rise of the central portion is to clear any rotating portion of the fan 12. It also aids in air flow. Bent mounting tabs 39 will fix the diameter for the bottom end of the side straps, once the fasteners 19 are installed.

To clip the fan 12 into place one simply holds it and the heat sink body, places the fan onto the body, and then springs the side straps 25 and 26 away from each other while bringing the mounting clip 20 into the position shown, whereupon the side straps are pushed toward each other to overcome the slight interference between the bottom of the heat sink body 2 and the locations 31 and 32 of the removable mounting clip 20. At this point we have a fan/heat sink combination that forms an active heat sink.

Figure 4:
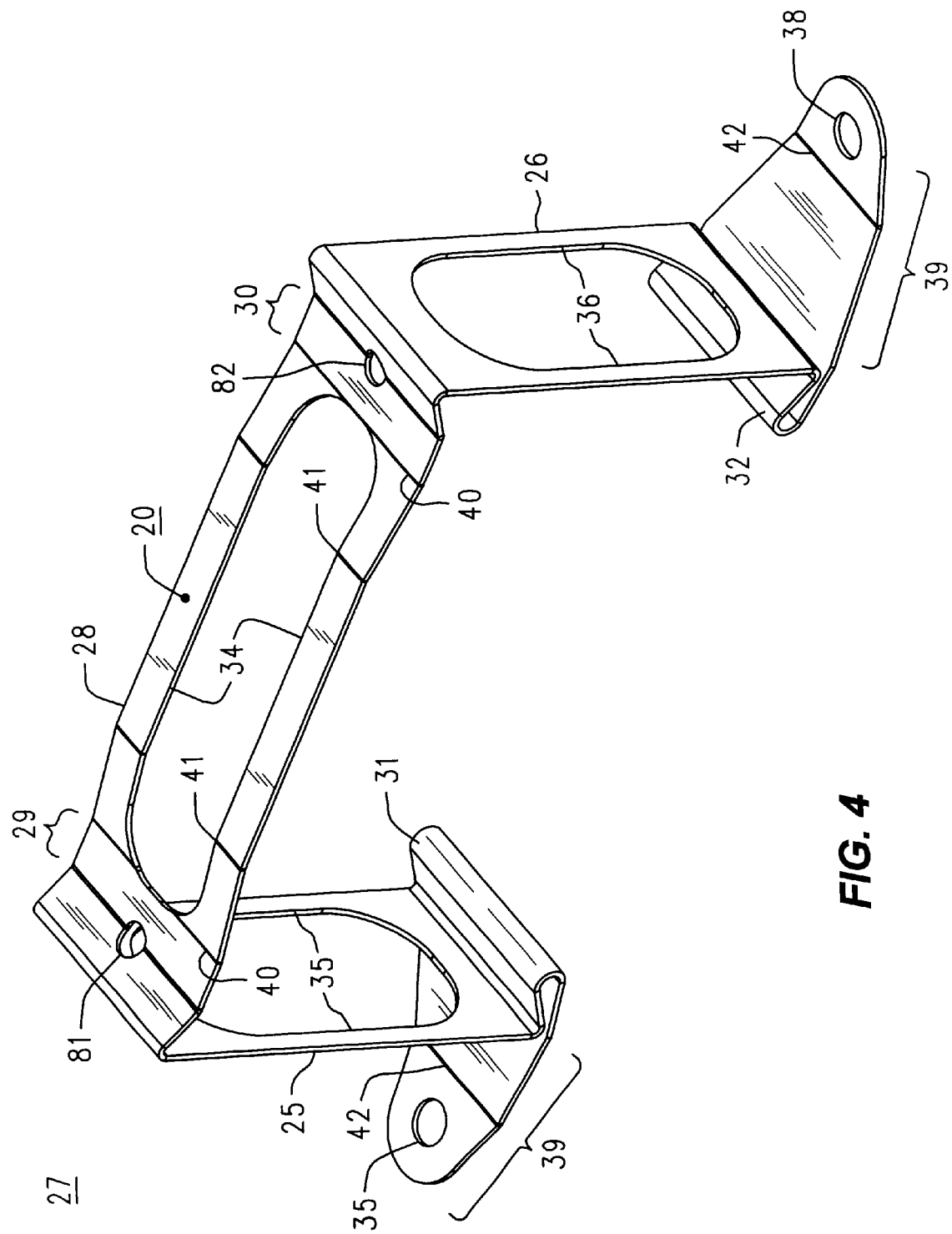
FIG. 4 is an isometric view of the removable mounting clip of the embodiment shown in FIG. 3.

Before moving on to mounting that combination against the part 6, there are some other features that should be noted and that are best seen in FIG. 4. Note the open region 34 along the top strap 28. This avoids blocking air flow into the top of the active heat sink while it is in operation. In a similar way, open regions 35 and 36 allow air flow in and out of the sides of the active heat sink. (A Wagner active heat sink both draws air in at the top of the sides and exhausts it at the bottom of the sides.) Note the holes 81 and 82 along the top strap. They accept optional posts 79 and 80 on the top of the fan 12 (see FIG. 3). This not only keeps the overall body of the fan 12 from rotating once installed, but resists motion of the active heat sink in and out of the paper, as viewed in FIG. 3. That is, the active heat sink will stay registered in the proper position relative to the part to be cooled, and can't slip off.

See also the mounting holes 38 in bent tabs 39. They accept the screws or other fasteners 19 that secure the entire active heat sink assembly to the part to be cooled 6 and the printed circuit board 5 carrying that part.

Note the U-shaped regions at the lower ends of the removable mounting clip 20, in the vicinity of the points of contact 31 and 32. These not only function as part of the resilient structure that holds the fan in place, as described above, but they also function to provide the resilient compression that causes the butt end of cylindrical plug 18 to bear against the top of part 6. That is, owing to the U-shaped bend mounting tabs 39 will, in the absence of the fasteners 19 drawing them down against the printed circuit board 5, spring upward in the direction of arrows 21. This, in conjunction with the bends at locations 42 in the mounting tabs 39, provide the compression needed to keep the butt end of the cylindrical plug 18 against the top of part 6.

Figure 5:
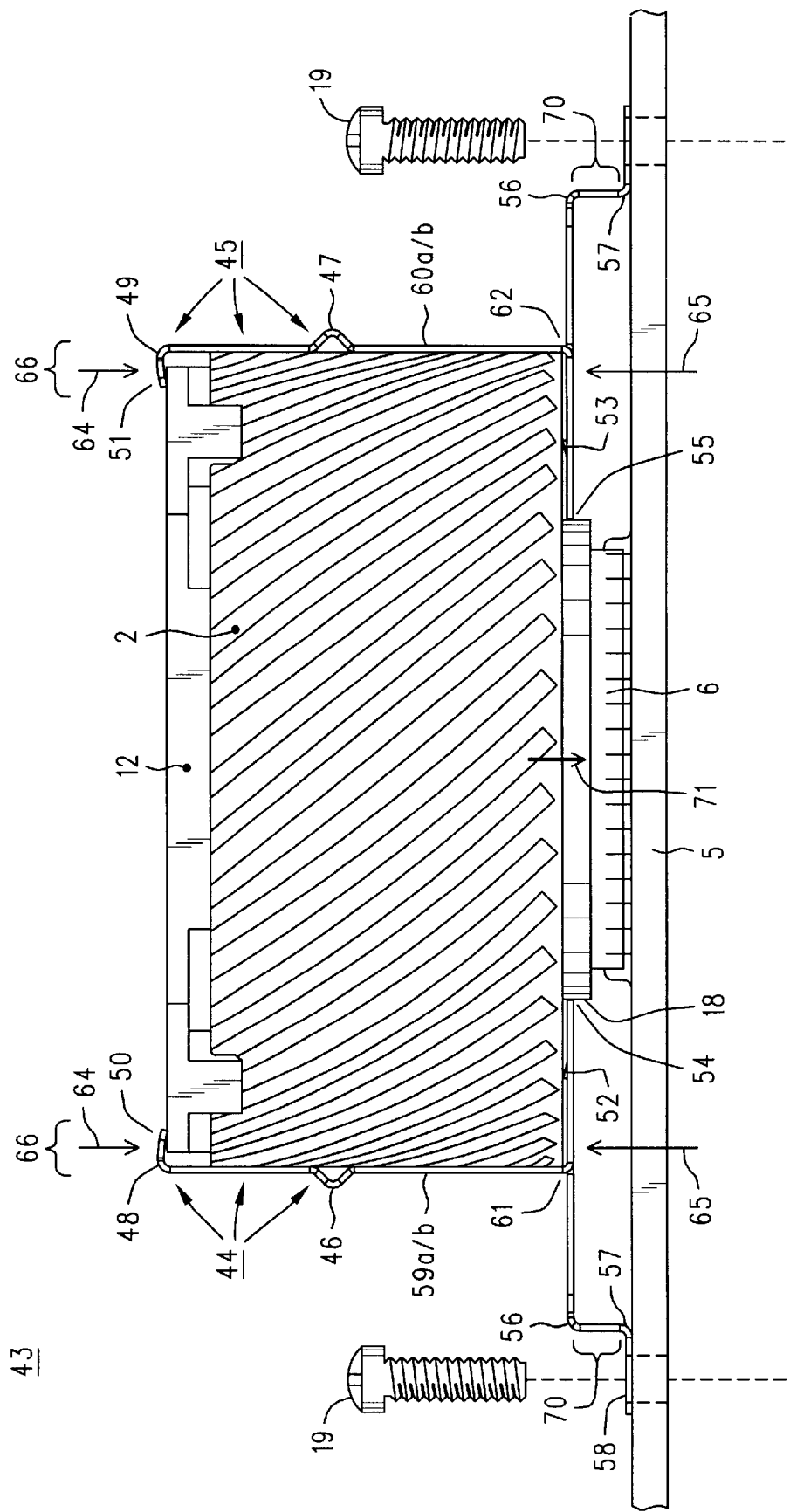
FIG. 5 is a side view of another preferred embodiment for a pair of removable mounting clips useable with the configuration of FIG. 2.
Figure 6:
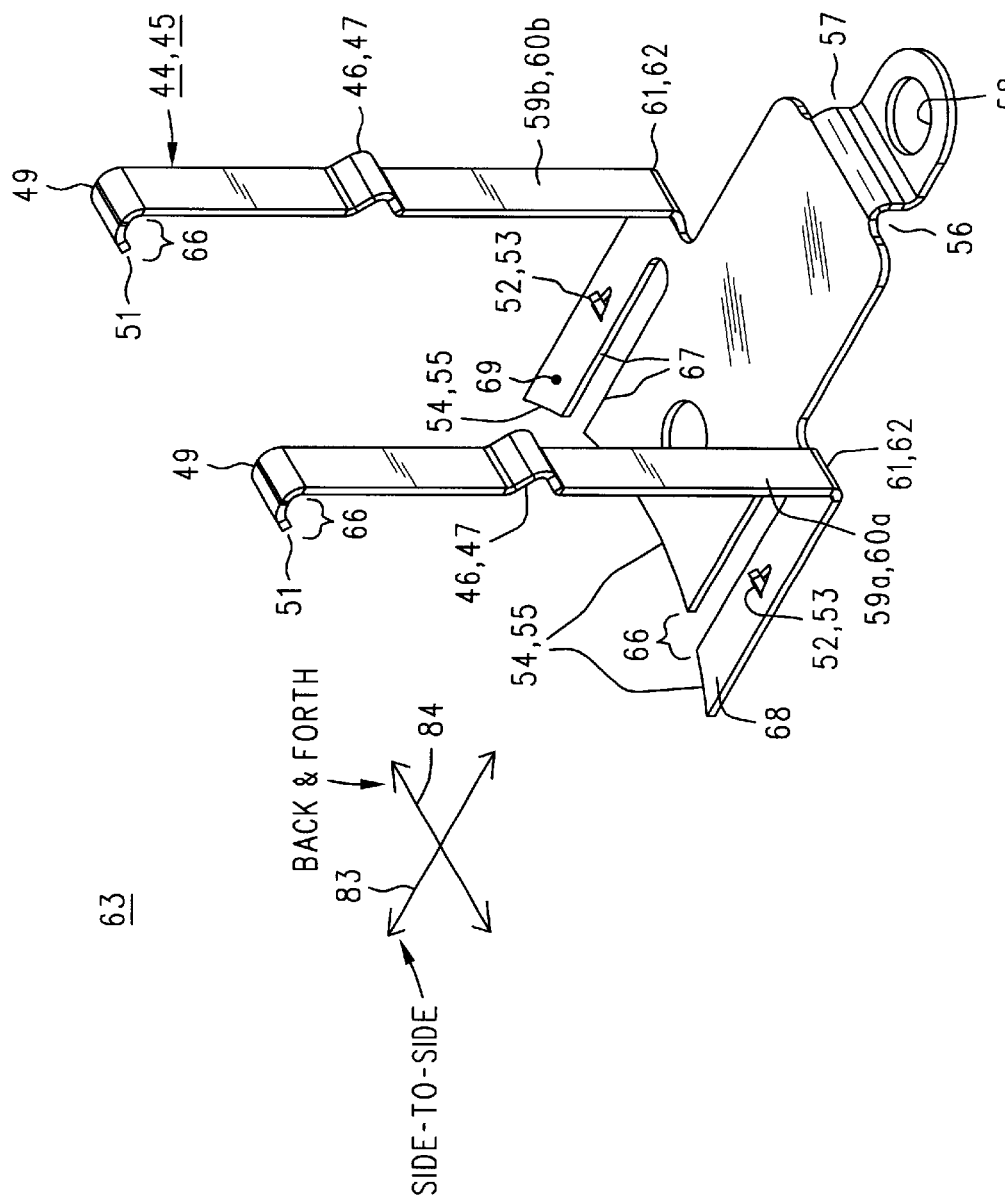
FIG. 6 is an isometric view of one of the pair of removable mounting clips of the embodiment shown in FIG. 5.

Refer now to FIGS. 5 and 6, where another preferred embodiment for removable mounting clips is described. FIG. 5 is a side view 43 of how a pair of removable mounting clips 44 and 45 cooperate to secure the motorized fan 12 to heat sink body 2, while at the same time mounting the entire active heat sink assembly against the top of part 6. FIG. 6 is an isometric view 63 of one of clips 44 or 45 in isolation.

As seen in FIG. 5, a resilient compression in the direction of arrows 64 and 65 keeps fan 12 atop the heat sink body 2. This is accomplished by the length of the side straps 59 and 60 being slightly short, in conjunction with bends 46 and 47 providing slight extensibility under tension, and the greater than ninety degree bends 48 and 49 that cooperate to produce tension against the flat bottom of the clip in the vicinity of arrows 65. The length of the upper mounting tabs 66 produces points of contact 50 and 51 that are interior to the periphery of the fan 12. This, in conjunction with the compression between arrows 64 and 65, and the upward barbs or tangs 52 and 53, resist any tendency of the removable mounting clips 44 and 45 to rotate away from the heat sink body 2 (using points of contact 50 and 51 as pivot points). Such rotation would result in mechanical interference at the bottom edges of the heat sink body with the mounting clips in the vicinity of arrows 65.

A look at FIG. 6 reveals that side straps 59 and 60 are actually two straps each: 59a/b and 60a/b. Note that the use of two narrow side straps separated by a space assists in air flow through the sides of the heat sink body 2. Also note curved regions 54 and 55 that abut the cylindrical plug 18 from both sides, and that owing to their curvature, produce potential mechanical interference in all but one position. They serve to register the butt end of the cylindrical plug in the proper position against the top of the part 6 to be cooled. They do this for the side-to-side direction and the back and forth direction, as indicated by arrows 83 and 84, respectively. Also note the barbs 52 and 53. These barbs are located on fingers 68 and 69 that are separated from the central portion of the bottom of the mounting clip by troughs or U-shaped cut-outs 66 and 67. The purpose of this is to allow the fingers carrying the barbs to flex slightly, while allowing the central portion to remain in firm contact against the bottom of the heat sink body.

To mount the removable mounting clips 44 and 45 on the heat sink body 2, one simply engages each one at points of contact 50 or 51, and rotates them into place with a slight squeezing applied between the bends 49 and the holes 58 in the mounting tabs. Once mounting screws 19 or other fasteners are in place through mounting holes 58, the distance between the lower ends of the side straps 59 and 60 is fixed at the diameter of the heat sink body. The stiffness of the material at bends 62 and 61, in conjunction with a slight gouging or gripping action at points of contact 50 and 51 limits any tendency of the tops of the side straps to bend away from the top portion of the heat sink body.

The stiffness of the central bottom portion of the clips 44 and 45, in conjunction with the slightly too short rise 70 at bends 56 and 57, produces a compression, in the direction of arrow 71, that urges the heat sink assembly against the top of part 6.

Figure 7:
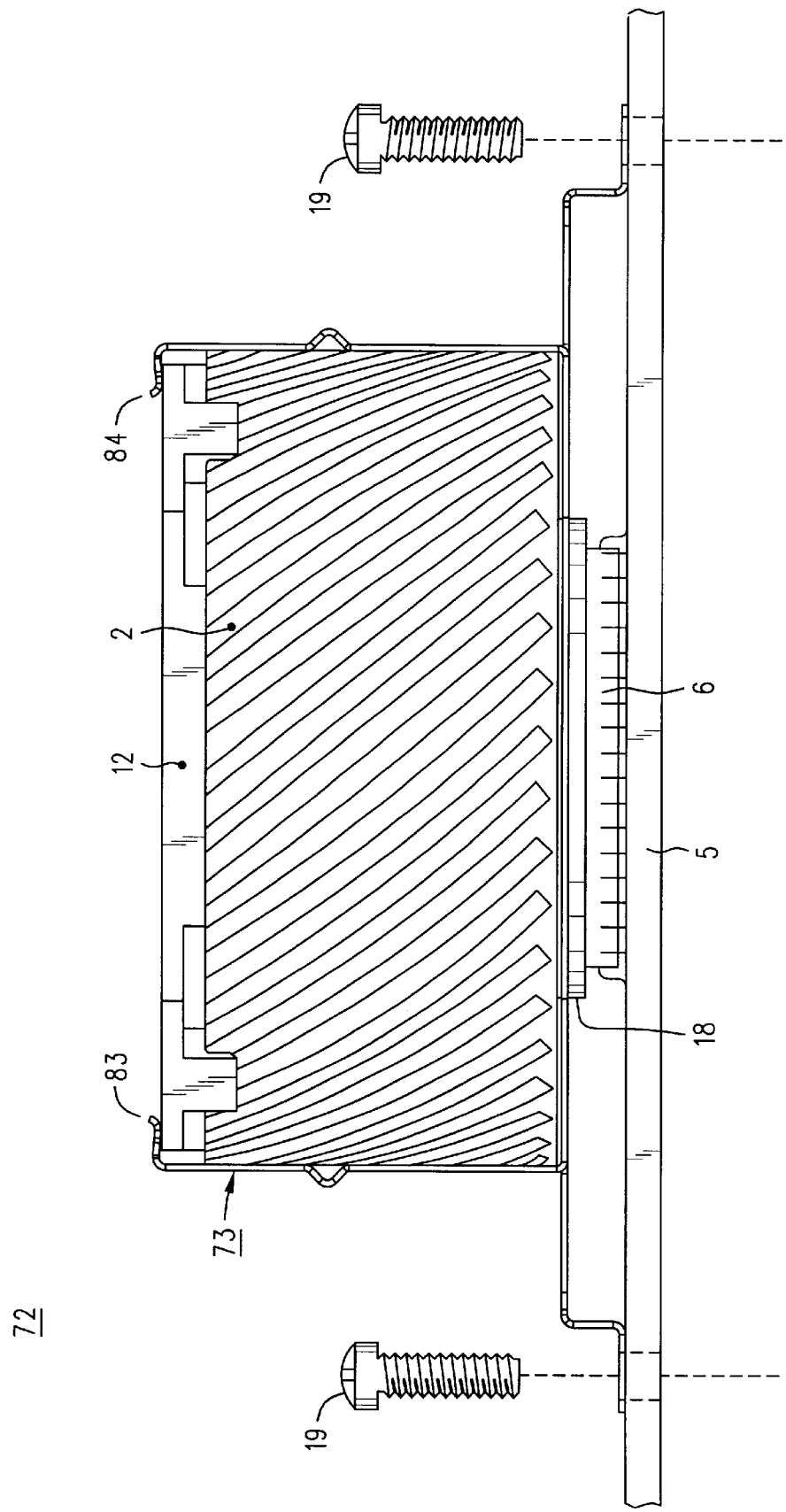
FIG. 7 is a side view of yet another preferred embodiment for a removable mounting clip useable with the configuration of FIG. 2.
Figure 8:
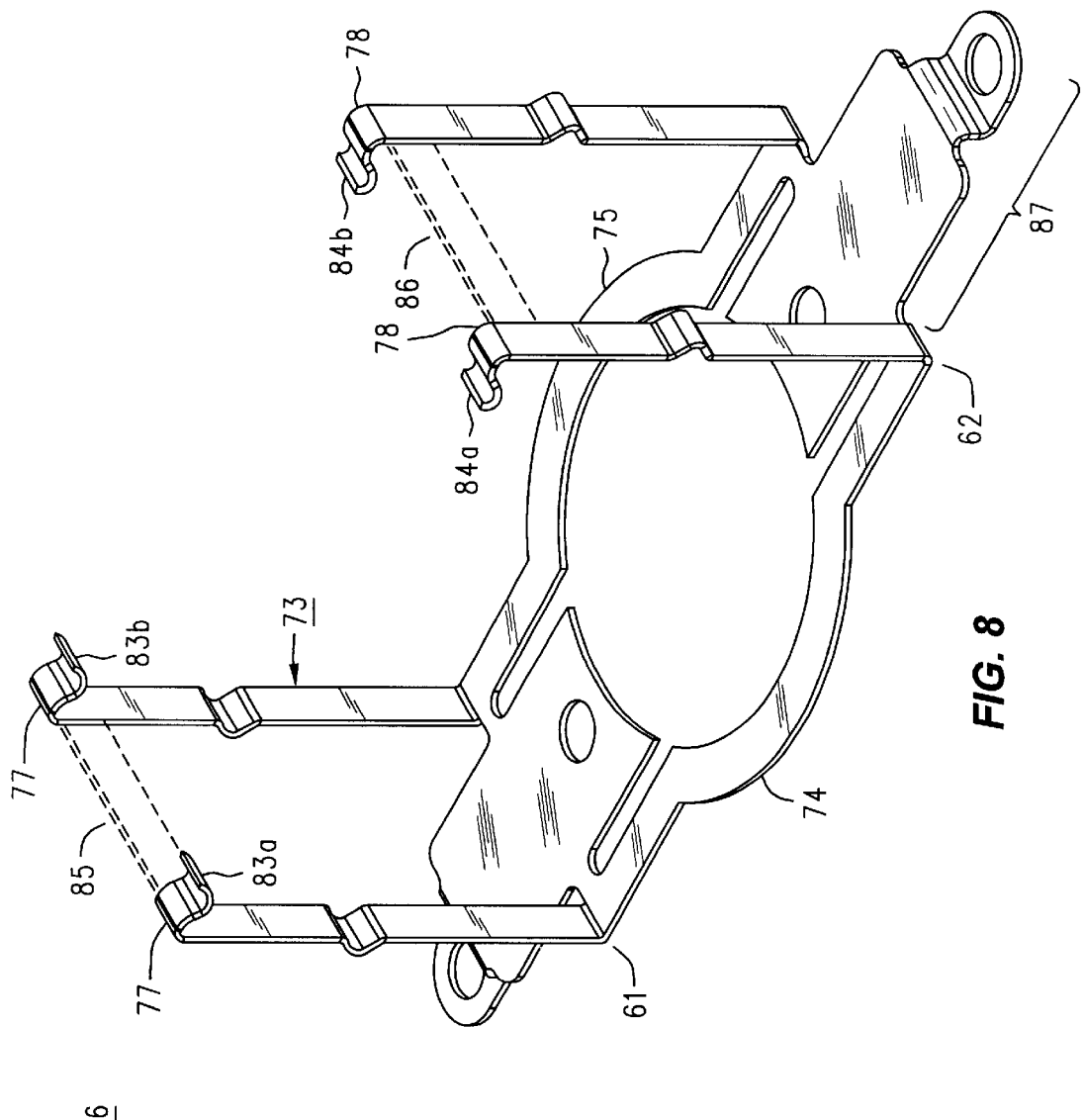
FIG. 8 is an isometric view of the removable mounting clip of the embodiment shown in FIG. 7.

Refer now to FIGS. 7 and 8, where yet another preferred embodiment for removable mounting clips is described. FIG. 7 is a side view 72 of how a removable mounting clip 73 secures the motorized fan 12 to heat sink body 2, while at the same time mounting the entire active heat sink assembly against the top of part 6. FIG. 6 is an isometric view 76 of clip 73 in isolation.

It is clear from a comparison of FIG. 8 with FIG. 6 that removable mounting clip 73 operates in basically the same manner as the pair of clips 44 and 45. Accordingly, we shall not repeat all the similarities; the reader will have no trouble at all in identifying those. Instead, it will be sufficient to point out the differences, which are principally the presence of the curved connecting pieces 74 and 75, and the absence of the barbs 52 and 53. The barbs are not needed, since the curved connecting pieces (which fit around the cylindrical plug 18 and provide registration) prevent the bends at locations 61 and 62 from moving away from each other, forcing them to stay fixed at the diameter of the heat sink body. Another difference is in the technique for installation. In this embodiment one spreads the tops 77 and 78 of the side straps away from each other, and then inserts the heat sink body 2 and the fan 12, after which the tops 77 and 78 are released, and then pushed toward each other. To facilitate the pushing of the tops 77 and 78, their ends have reverse curves 83a/b and 84a/b that slide easily over the top of the fan without gouging.

It will be appreciated that the removable mounting clips 20,44/45 and 73 can all be easily formed from flat sheet metal stock, with only the use of the basic operations of shearing, punching and bending; there are no spot welds nor other types of fastening used to create an appendage that cannot otherwise be produced from the flat stock by cutting and folding. That said, it certainly is conceivable that these parts could be produced as molded plastic pieces. Suitable materials include polyamide and polyphenylene sulphide.

Certain alterations and modifications are possible while staying within the scope of the invention. For example, and with reference to FIG. 8, in a sheet metal part the metal needed for connecting bridges 85 and 86 (connecting each pair of side straps together) would be available if the side straps are long enough compared to the length 87 of the mounting tab. That comparison would, of course, not be an issue in a molded part. The same connecting bridges could be incorporated into the embodiment shown in FIGS. 6 and 7, too.

Another minor modification that may be desirable, and that is applicable to each of the embodiments disclosed, concerns how close the side straps are to the exterior of the heat sink body. At one extreme is the case (essentially as shown) where the side straps are quite close. It may sometimes be the case that an increase in noise level during operation is a result. The cure is to move the side straps out a ways. The preferred way that this may be done is by including some auxiliary bends in the side straps, near their tops and bottoms, to jog their central portions outward by, say, 0.10 to 0.250 of an inch. The idea is to do for the side straps what the bends at locations 40 and 41 do for the top strap 28 of FIGS. 3 and 4. All other bends are left in their same positions relative to the heat sink body, so that the mechanical aspects of using the removable mounting clip with jogged side straps to mount the motorized fan to the heat sink body, and the whole assembly to the part to be cooled, remain exactly as before.

There are at least two other ways that space could be introduced between the side straps and the outside of the heat sink body. One is to alter the profile of a Wagner active heat sink body such that it is of a larger diameter at the top and bottom, and of a smaller diameter therebetween. Or, the diameter could be left unchanged, the removable mounting clip designed as though the heat sink were slightly larger, and spacers used to occupy the difference.

Finally, it will be noted that the mounting clips 20, 44/45 and 73 are indeed easily removable. They do not involve the use of any adhesive, nor of any "one way" push on fasteners, etc. With these clips it is possible to attach a motorized fan to a heat sink body, and then the whole active heat sink assembly to a part to be cooled, as well as later dismantle that arrangement, for say, replacement of a failed fan. Afterward, it is a simple matter to reassemble and re-attach the unit using the same removable mounting clip(s).

We claim:

1. A clip for attaching a fan to a heat sink and mounting that combination against a surface to be cooled, the clip comprising:

first and second side straps, each having first and second locations whose distance apart along the side strap is generally the height of the heat sink with the fan attached, and each side strap having a resilient bend at each of the first and second locations, the bends forming on each side strap a pair of opposing contact surfaces that resiliently compress the fan and heat sink together by bearing against the fan with one of the opposing contact surfaces and against the fan with the other;

a top strap extending between and joining the side straps proximate where their respective contact surfaces bears against the fan; and each side strap extending beyond the contact surface bearing against the heat sink, and each having therealong a generally resilient U-shaped bend terminating in a mounting tab that, when fastened against a mounting surface communicates the resilience of the U-shaped bend as a force that urges, against the surface to be cooled, an outside surface of the heat sink that is disposed opposite the fan.

2. A clip as in claim 1 wherein the top strap includes auxiliary bends proximate where it joins the side straps and is therebetween displaced away from the fan.

3. A clip as in claim 1 wherein the top strap includes an air passage of removed material.

4. A clip as in claim 1 wherein each side strap includes an air passage of removed material.

5. A clip as in claim 1 wherein each side strap includes auxiliary bends disposed at separate locations along its length proximate the side of the heat sink and is therebetween displaced away from the side of the fan.

6. A clip as in claim 1 wherein the clip is of stainless steel.

7. A clip as in claim 1 wherein the top strap includes a plurality orifices that register with and engage a corresponding plurality of projecting posts on the surface of the fan and proximate the top strap.

8. A clip as in claim 1 wherein the fan has impellers that are disposed within a cavity interior to the heat sink.

9. A clip as in claim 1 wherein the heat sink is a counter flow two pass finned heat sink.

* * * * *